United States Patent [19]

Pennell et al.

[11] 4,291,351
[45] Sep. 22, 1981

[54] FLUX EXTENDER OR GUIDE FOR MAGNETIC READ HEAD HAVING A MAGNETORESISTIVE FLUX SENSOR

[75] Inventors: George F. Pennell, Vestal, N.Y.; Ralph D. Silkensen, Tucson, Ariz.; Joseph E. Wallace, Charlotte, N.C.

[73] Assignee: International Business Machines Corporation, Armonk, N.Y.

[21] Appl. No.: 98,286

[22] Filed: Nov. 28, 1979

[51] Int. Cl.³ .............................................. G11B 5/30
[52] U.S. Cl. .................................................... 360/113
[58] Field of Search ......................................... 360/113

[56] References Cited

U.S. PATENT DOCUMENTS

| | | | |
|---|---|---|---|
| 3,274,575 | 9/1966 | DeKoster | 360/113 |
| 3,671,681 | 6/1972 | Stauffer | 360/113 |
| 3,921,217 | 11/1975 | Thompson | 360/113 |

OTHER PUBLICATIONS

Pennella et al., "Flux Extender...", IBM Tech. Disc. Bull., vol. 21, No. 7, Dec. 1978, p. 2716.

*Primary Examiner*—Robert S. Tupper
*Attorney, Agent, or Firm*—Paul M. Brannen

[57] ABSTRACT

A flux extender or guide for a magnetic read head having a magnetoresistive read element. The element is mounted on a substrate, contained, for example, in a hand-held wand structure. The element is spaced from the contact portion of the wand, to permit a small amount of wear of the head to take place, before the read element comes into contact with the record media. In order to increase the spacing between the magnetoresistive element and the contact portion of the wand, the flux guide or extender is utilized. The flux guide or extender is a wedge-shaped piece of magnetizable material.

At the end of the flux guide closest to the read element, the guide is approximately as wide as the element and tapers down to approximately three quarters of its top width at the lower end of the guide. The guide is of uniform thickness and thicker than the read element. The cross-sectional area is selected to be from two to three times the cross-sectional area of the read element. The flux guide is preferably fabricated from a magnetic material which is non-corrosive or less corrosive than the read element and having a higher value of flux density than the element. The width of the guide at the lower end is less than the width of the element, which permits higher density of magnetized bits per inch to be decoded. Also, the length of the guide is less than the minimum distance between flux transitions for good resolution.

1 Claim, 3 Drawing Figures

FLUX EXTENDER OR GUIDE FOR MAGNETIC READ HEAD HAVING A MAGNETORESISTIVE FLUX SENSOR

BACKGROUND OF THE INVENTION

1. Field of the Invention

This invention relates to magnetic read heads and particularly to magnetic read heads of the type using a magnetoresistive element as the scanning device. More particularly, the invention relates to magnetic read heads having a magnetoresistive element spaced apart from the contact portion of the head, and to an improved flux extender or guide for channeling or directing magnetic flux to the element, and providing improved performance with the head assembly.

2. Description of the Prior Art

A magnetoresistive element in a magnetic recording head is shown and described in U.S. Pat. No. 3,921,217. The patented device includes a flux guide 12 disposed between the element 14 and the recording medium. The flux guide 12 is rectangular in shape and of substantially uniform thickness.

The geometry of the patented arrangement does not correspond to the geometry found in the present arrangement; for example, the flux guide according to the present invention is tapered from a width substantially equal to the magnetoresistive element at the end adjacent to the element, to a lesser width at the end adjacent the record media.

SUMMARY OF THE INVENTION

It is accordingly a principal object of the present invention to provide an improved flux extender or guide extending between a magnetoresistive read element and a magnetic recording media.

Another object of the invention is to provide an improved flux extender which permits higher density of magnetized bits per inch to be decoded.

Another object of the invention is to provide an improved flux extender which permits operation at various skew angles.

A further object of the invention is to provide a more economical flux extender than those of the prior art.

Another object of the invention is to provide a flux extender which does not have to be magnetoresistive material.

Another object of the invention is to provide a flux extender which is in direct line with the magnetoresistive read element.

A further object of the invention is to provide an improved flux extender which provides good resolution between magnetized bits of the recording media.

Briefly described, the present invention contemplates an improved flux extender comprising a wedge shaped piece of suitable magnetic material, having a width substantially the same as the associated magnetoresistive element at the end of the wedge adjacent to the element and tapering to a lesser width at the end adjacent to the recording media, of the order of 75% of the greater width. The thickness of the extender is constant and thicker than the magnetoresistive element.

The cross-sectional area is selected to be from two to three times the cross-sectional area of the magnetoresistive element to assure that the magnetoresistive element is operated in the saturated condition. The flux guide is preferably fabricated from a magnetic material which is noncorrosive or less corrosive than the magnetoresistive element and having a higher value of flux density than the magnetoresistive element. The width of the guide at the lower end is less than the width of the magnetoresistive element, which permits higher density of magnetized bits per inch to be decoded when the magnetoresistive element is operated at various skew angles. Also, the length of the guide is less than the minimum distance between flux transitions for good resolution.

The foregoing and other objects, features and advantages of the invention will be apparent from the following more particular description of a preferred embodiment of the invention, as illustrated in the accompanying drawings.

DETAILED DESCRIPTION OF A PREFERRED EMBODIMENT

Figure 1:
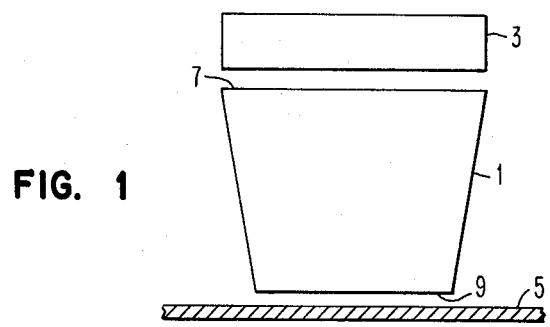
FIG. 1 is a front elevational view, in schematic form, showing the relationship of the flux extender according to the invention, the associated magnetoresistive element, and the record media.
Figure 2:
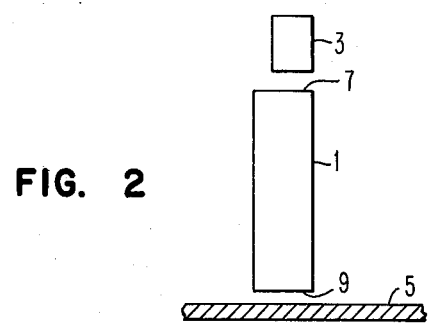
FIG. 2 is a side elevational view, in schematic form, of the arrangement of FIG. 1.

Referring to FIGS. 1 and 2 of the drawings, there is shown a flux extender 1, in accordance with the present invention. The flux extender, or flux guide, is disposed between a magnetoresistive read element 3, and a magnetic recording medium 5.

The remainder of the head structure other than element 3, is not shown, since it is not germane to the invention, and may be arranged in various ways, as disclosed for example in U.S. Pat. No. 3,921,217, referred to previously.

At the top end 7 of the flux guide 1 closest to magnetoresistive element 3, the guide is approximately as wide as element 3 and tapers down to approximately three quarters of its top width at the lower end 9 of the guide, which is closest to the record media 5. As seen in the side view, the guide 1 is of uniform thickness and thicker than the magnetoresistive element. The cross-sectional area of the guide is selected to be from two to three times the cross-sectional area of the magnetoresistive element to assure saturation of the magnetoresistive element. The flux guide is preferably fabricated from a magnetic material which is noncorrosive or less corrosive than the magnetoresistive element and has a higher value of B than the magnetoresistive element.

High density of magnetized bits per inch is achieveable on the magnetic media 5, as a result of the taper of the extender or guide 1. The length of the guide 1, from top end 7 to bottom end 9 is selected to be less than the minimum distance between flux transitions in the media 5, to provide good resolution.

Figure 3:
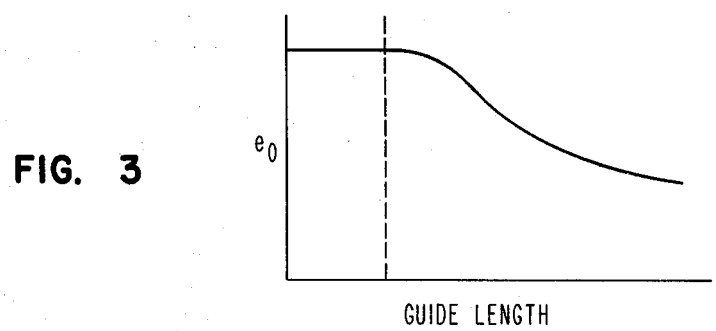
FIG. 3 is a graph showing the relationship of extender length to output signal.

FIG. 3 illustrates the relation of the output signal $e_0$ which can be obtained from the magneto-resistive element, to the length of the flux guide. It is seen that an optimum length of guide can be obtained, in which good wear performance is achieved without any degradation in the output signal $e_0$. This length should be less than the minimum distance between flux transitions.

From the foregoing it will be apparent that the present invention provides a more efficient flux guide or extender, which in turn enhances the performance of the entire read head assembly.

While the invention has been particularly shown and described with reference to a preferred embodiment thereof, it will be understood by those skilled in the art that various changes and modifications in form and details may be made therein without departing from the spirit and scope of the invention.

We claim:

1. A flux guide for a magnetic reading head having a magneto-resistive reading element spaced apart from the area of said head which contacts the reading medium, comprising a wedge shaped flux guide element spaced between said magneto-resistive element and said contact area, said guide element having its wider end closest to said magneto-resistive element, said wider end having a width substantially equal to that of the magneto-resistive element, each edge of said guide element being straight throughout its length, said guide element having a thickness which is constant and substantially greater than the thickness of the magneto-resistive element, said guide element being fabricated from material which is less corrosive than said magneto-resistive element, and having a higher flux density than said magneto-resistive element, said guide element having a width at its narrow end substantially equal to seventy five percent of the width of the wider end of said guide element, and having a length which is less than the minimum distance between flux transitions in the media.

* * * * *